(12) United States Patent
Hada et al.

(10) Patent No.: US 7,682,770 B2
(45) Date of Patent: *Mar. 23, 2010

(54) RESIST COMPOSITION AND METHOD FOR FORMING RESIST PATTERN

(75) Inventors: Hideo Hada, Kawasaki (JP); Masaru Takeshita, Kawasaki (JP); Ryotaro Hayashi, Kawasaki (JP); Syogo Matsumaru, Kawasaki (JP); Taku Hirayama, Kawasaki (JP); Hiroaki Shimizu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/576,405

(22) PCT Filed: Oct. 20, 2004

(86) PCT No.: PCT/JP2004/015504

§ 371 (c)(1), (2), (4) Date: Apr. 30, 2007

(87) PCT Pub. No.: WO2005/040922

PCT Pub. Date: May 6, 2005

(65) Prior Publication Data

US 2007/0275307 A1 Nov. 29, 2007

(30) Foreign Application Priority Data

Oct. 23, 2003 (JP) .............................. 2003-363521
Dec. 9, 2003 (JP) .............................. 2003-410489
Mar. 2, 2004 (JP) .............................. 2004-057448

(51) Int. Cl.
G03F 7/039 (2006.01)
G03F 7/028 (2006.01)

(52) U.S. Cl. ..................... 430/270.1; 430/326; 430/921

(58) Field of Classification Search .............. 430/270.1, 430/913, 914, 919, 921, 326
See application file for complete search history.

(56) References Cited

U.S. PATENT DOCUMENTS

| | | | |
|---|---|---|---|
| 5,554,664 A | 9/1996 | Lamanna et al. | |
| 5,968,713 A | 10/1999 | Nozaki et al. | |
| 6,013,416 A | 1/2000 | Nozaki et al. | |
| 6,344,304 B1 | 2/2002 | Takechi et al. | |
| 6,348,297 B1* | 2/2002 | Uetani et al. ............. | 430/270.1 |
| 6,358,665 B1 | 3/2002 | Pawlowski et al. | |
| 6,423,799 B1 | 7/2002 | Berneth et al. | |
| 6,596,458 B1 | 7/2003 | Sato et al. | |
| 6,656,659 B1 | 12/2003 | Nozaki et al. | |
| 6,692,889 B1 | 2/2004 | Funaki et al. | |
| 6,818,379 B2 | 11/2004 | Kamabuchi et al. | |
| 6,887,644 B1 | 5/2005 | Nozaki et al. | |
| 6,911,297 B2 | 6/2005 | Brzozowy et al. | |
| 6,958,206 B2 | 10/2005 | Tsuchimura et al. | |
| 7,220,808 B2 | 5/2007 | Yamagishi et al. | |
| 2001/0014428 A1 | 8/2001 | Uetani et al. | |
| 2002/0132181 A1* | 9/2002 | Nishimura et al. ....... | 430/270.1 |
| 2002/0150834 A1 | 10/2002 | Yamamoto et al. | |
| 2003/0049456 A1 | 3/2003 | Kawasato et al. | |
| 2003/0108809 A1* | 6/2003 | Sato ............................ | 430/171 |
| 2003/0207201 A1 | 11/2003 | Hatakeyama et al. | |
| 2004/0186216 A1 | 9/2004 | Satoh et al. | |
| 2004/0259028 A1* | 12/2004 | Sato ....................... | 430/270.1 |
| 2005/0014090 A1 | 1/2005 | Hirayama et al. | |
| 2005/0095532 A1* | 5/2005 | Kodama et al. .......... | 430/270.1 |
| 2005/0203262 A1 | 9/2005 | Feiring et al. | |
| 2007/0065748 A1* | 3/2007 | Hada et al. ............... | 430/270.1 |

FOREIGN PATENT DOCUMENTS

| | | |
|---|---|---|
| EP | 0 982 628 A2 | 3/2000 |
| EP | 0663616 | 10/2002 |
| JP | H04-039665 | 2/1992 |
| JP | H05-346668 | 12/1993 |

(Continued)

OTHER PUBLICATIONS

Padmanaban M., Dammel R., Lee S., Kim W., Kudo T., McKenzie D., Rahman D.—"Performance of Imide and Methide Onium PAGs in 193 nm Resist Formulations", Advances in Resist Technology and Processing XX, Proceedings of SPIE vol. 5039 (2003), pp. 743-751.*

(Continued)

*Primary Examiner*—Cynthia H Kelly
*Assistant Examiner*—Anca Eoff
(74) *Attorney, Agent, or Firm*—Knobbe, Martens, Olson & Bear, LLP

(57) ABSTRACT

A resist composition is provided that yields fine resolution, and improved levels of line edge roughness and depth of focus. This composition includes a resin component (A) that undergoes a change in alkali solubility under the action of acid, and an acid generator component (B) that generates acid on exposure, wherein the component (A) is a resin with a weight average molecular weight of no more than 8,000 containing structural units (a) derived from a (meth)acrylate ester, and the component (B) includes at least one sulfonium compound represented by a general formula (b-1) or a general formula (b-2) shown below.

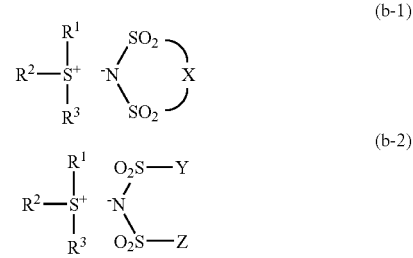

14 Claims, No Drawings

FOREIGN PATENT DOCUMENTS

| | | |
|---|---|---|
| JP | H07-234511 | 9/1995 |
| JP | 10-226658 | 10/1996 |
| JP | H09-073173 | 3/1997 |
| JP | H09-090637 | 4/1997 |
| JP | H10-161313 | 6/1998 |
| JP | H10-319595 | 12/1998 |
| JP | H11-012326 | 1/1999 |
| JP | 2000-321771 | 11/2000 |
| JP | 2001-002735 | 1/2001 |
| JP | 2002-145954 | 5/2002 |
| JP | 2002-311587 | 10/2002 |
| JP | 2003-140346 | 5/2003 |
| JP | 2003-160612 | 6/2003 |
| JP | 2003-231673 | 8/2003 |
| JP | 2003-287884 | 10/2003 |
| JP | 2003-307850 | 10/2003 |
| JP | 2004-057449 | 2/2004 |
| JP | 2004-85657 | 3/2004 |
| JP | 2005-534956 | 11/2005 |
| WO | WO 02/077116 | 10/2002 |

OTHER PUBLICATIONS

Office Action issued Jun. 10, 2008, on the counterpart Japanese Application No. 2004-57448.

Przybilla K.J. et al., "Hexafluoroacetone in Resist Chemistry: A Versatile New Concept for Materials for Deep UV Lithography", *SPIE vol. 1672 Advances in Resist Technology and Processing IX* (1992), pp. 500-512.

* cited by examiner

RESIST COMPOSITION AND METHOD FOR FORMING RESIST PATTERN

CROSS-REFERENCE TO RELATED APPLICATIONS

This application is the U.S. National Phase filing under 35 U.S.C. §371 of PCT/JP2004/015504, filed Oct. 20, 2004, which designated the United States and was published in a language other than English, which claims priority under 35 U.S.C. §119(a)-(d) to Japanese Patent Application Nos. 2003363521, filed Oct. 23, 2003; 2003410489, filed Dec. 9, 2003; and 2004057448, filed Mar. 2, 2004. The content of these applications is incorporated herein by reference in their entireties.

TECHNICAL FIELD

The present invention relates to a resist composition and a method for forming a resist pattern.

Priority is claimed on Japanese Patent Application No. 2003-363,521, filed Oct. 23, 2003, Japanese Patent Application No. 2003-410,489, filed Dec. 9, 2003, and Japanese Patent Application No. 2004-57,448, filed Mar. 2, 2004, the contents of which are incorporated herein by reference.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation such as g-line and i-line radiation has been used as the exposure light source, but recently, KrF excimer lasers (248 nm) have been introduced.

Furthermore, one example of a resist material that satisfies the high resolution conditions required to enable reproduction of a pattern of minute dimensions is a chemically amplified resist composition, which includes a base resin that undergoes a change in alkali solubility under the action of acid, and an acid generator that generates acid on exposure. Chemically amplified resist compositions include negative compositions, which contain an alkali-soluble resin (a base resin), an acid generator, and a cross-linking agent, and positive compositions, which contain a resin that exhibits increased alkali solubility under the action of acid (a base resin) and an acid generator.

Currently, onium salts are the most commonly used acid generators.

In recent years, with the rapid miniaturization of semiconductor elements, ever higher levels of resolution are being demanded, and for example, line and space resolutions of 90 nm or less are now being sought. As a result, LER (line edge roughness) is becoming a serious problem.

However, currently, the anion portions (the acid portions) of the onium salts used as acid generators are almost all chain-like fluorinated alkylsulfonate ions, and other acids are not used due to problems with the degree of acidity. In terms of enabling favorable control of the diffusion length of the acid within the resist film, the alkyl chain within these fluorinated alkyl groups preferably contains a large number of carbon atoms, but fluorinated alkylsulfonic acids in which the alkyl chain contains 4 or more carbon atoms are starting to attract comment over concerns about safety, and the use of such compounds is now being restricted on a worldwide basis.

Accordingly, an acid generator that provides a short diffusion length within the resist film without using the above types of long-chain fluorinated alkylsulfonic acids is now required.

(Patent Reference 1)

Japanese Unexamined Patent Application, First Publication No. 2003-160612

(Patent Reference 2)

Japanese Unexamined Patent Application, First Publication No. 2003-140346

(Patent Reference 3)

Japanese Patent (Granted) Publication No. 3,390,702

DISCLOSURE OF INVENTION

Problems to be Solved by the Invention

The inventors of the present invention noticed that specific sulfonium compounds disclosed in the formulas (b-1) and (b-2) shown below were favorable as the above type of acid generator.

However, if these sulfonium compounds were simply combined with conventional ArF resins, then satisfying the aforementioned fine levels of resolution, together with LER and depth of focus requirements, was still problematic.

The present invention takes the above circumstances into consideration, with an object of providing a resist composition that exhibits a high level of resolution, minimal LER, and a broad depth of focus, as well as a method for forming a resist pattern that uses such a resist composition.

Means for Solving the Problems

As a result of intensive investigation aimed at achieving the above object, the inventors of the present invention discovered that by using a combination of a resin with a low weight average molecular weight, that is, a resin with a weight average molecular weight of no more than 8,000, and a specific acid generator, a satisfactory level of resolution could be ensured, while the LER and depth of focus could be improved dramatically compared with resist compositions using conventional resins. Furthermore, they also discovered that other characteristics (such as the resist pattern shape and the level of developing defects) were also significantly superior to those obtained using conventional resins, and they were hence able to complete the present invention.

In other words, a first aspect of the present invention is a resist composition which includes a resin component (A) that undergoes a change in alkali solubility under the action of acid, and an acid generator component (B) that generates acid on exposure, wherein the component (A) is a resin with a weight average molecular weight of no more than 8,000, containing structural units (a) derived from a (meth)acrylate ester, and the component (B) includes at least one sulfonium compound represented by a general formula (b-1) or a general formula (b-2) shown below.

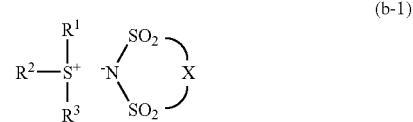

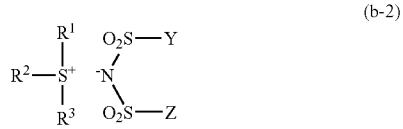
(b-2)

In the formulas, X represents an alkylene group of 2 to 6 carbon atoms in which at least one hydrogen atom has been substituted with a fluorine atom; Y and Z each represent, independently, an alkyl group of 1 to 10 carbon atoms in which at least one hydrogen atom has been substituted with a fluorine atom; $R^1$ to $R^3$ each represent, independently, an aryl group or an alkyl group, and at least one of $R^1$ to $R^3$ is an aryl group.

Furthermore, a second aspect of the present invention is a method for forming a resist pattern that includes the steps of forming a resist film on a substrate using the resist composition described above, conducting selective exposure treatment of the resist film, and then conducting alkali developing to form the resist pattern.

In the present invention, the term "(meth)acrylate ester" is a generic term that includes both methacrylate ester and acrylate ester. Furthermore, the term "structural unit" refers to a monomer unit that contributes to the formation of a polymer. Furthermore, the expression "structural unit derived from a (meth)acrylate ester" refers to a structural unit that is generated by cleavage of the ethylenic double bond of the (meth)acrylate ester.

EFFECTS OF THE INVENTION

According to a resist composition and a method for forming a resist pattern of the present invention, a resist pattern can be formed that exhibits a high level of resolution, a broad depth of focus, excellent resist pattern shape, and reduced levels of LER and defects.

BEST MODE FOR CARRYING OUT THE INVENTION

As follows is a more detailed description of the present invention.

<<Resist Composition>>

A resist composition of the present invention includes a resin component (A) (hereafter also referred to as the component (A)) that undergoes a change in alkali solubility under the action of acid, and an acid generator component (B) (hereafter also referred to as the component (B)) that generates acid on exposure.

The characteristic features of the present invention are that the component (A) is a resin with a weight average molecular weight of no more than 8,000, containing structural units (a) derived from a (meth)acrylate ester, and that the component (B) includes at least one sulfonium compound represented by either of the above general formulas (b-1) and (b-2).

Provided a resist composition of the present invention includes the above characteristic features, it may be either a positive composition or a negative composition. A positive composition is preferred.

In the case of a negative composition, the resist composition contains an alkali-soluble resin as the component (A), and a cross-linking agent. Then, during formation of the resist pattern, when acid is generated from the component (B) by exposure, the action of this acid causes cross-linking to occur between the alkali-soluble resin and the cross-linking agent, causing the alkali-soluble resin to become insoluble in alkali. As the cross-linking agent, typically an amino-based cross-linking agent such as a melamine with methylol groups or alkoxymethyl groups, urea, or glycoluril is used.

In the case of a positive composition, the component (A) is an alkali-insoluble resin that contains so-called acid dissociable, dissolution inhibiting groups, and the action of the acid generated from the component (B) through exposure causes the acid dissociable, dissolution inhibiting groups to dissociate, causing the entire component (A) to change from an alkali-insoluble state to an alkali-soluble state. As a result, when a resist is exposed through a mask pattern during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern. In the case of a positive composition, a resin containing structural units (a1) described below as the structural units (a) can be used favorably as the component (A).

<Component (A)>

In the present invention, because the component (A) is a resin with a weight average molecular weight of no more than 8,000 containing the structural units (a), it exhibits adequate transparency for use within a resist used in a process that employs a wavelength of 200 nm or less such as an ArF excimer laser. Furthermore, by combining this resin with the component (B) described below, a resist pattern can be formed that exhibits excellent resolution and pattern shape as well as reduced levels of LER and defects. In addition, the depth of focus (DOF) during formation of the resist pattern is large, and the shape of the obtained resist pattern is favorable.

[Structural Unit (a1)]

In those cases where the resist composition of the present invention is a positive composition, the component (A) is a resin in which the structural units (a) include structural units (a1) derived from a (meth)acrylate ester containing an acid dissociable, dissolution inhibiting group.

The acid dissociable, dissolution inhibiting group in the structural unit (a1) is a group which exhibits an alkali dissolution inhibiting effect that renders the entire component (A) alkali-insoluble prior to exposure, but then dissociates under the action of acid generated from the component (B) following exposure, causing the alkali solubility of the entire component (A) to increase.

There are no particular restrictions on the acid dissociable, dissolution inhibiting group in the structural unit (a1). Typically, groups that form a cyclic or chain-like tertiary alkyl ester with the carboxyl group of the (meth)acrylic acid are the most widely known, but in terms of providing excellent dry etching resistance and favorable formation of a resist pattern, an acid dissociable, dissolution inhibiting group that contains an aliphatic monocyclic or polycyclic group is preferred, and an acid dissociable, dissolution inhibiting group that contains an aliphatic polycyclic group is particularly desirable.

Examples of the above aliphatic monocyclic group include groups in which one hydrogen atom has been removed from a cycloalkane.

Specific examples include groups in which one hydrogen atom has been removed from cyclohexane or cyclopentane or the like.

Examples of the above aliphatic polycyclic group include groups in which one or two hydrogen atoms have been removed from a bicycloalkane, tricycloalkane, or tetracycloalkane or the like.

Specific examples include groups in which one or two hydrogen atoms have been removed from a polycycloalkane such as adamantane, norbornane, isobornane, tricyclodecane, or tetracyclododecane.

These types of monocyclic and polycyclic groups can be selected appropriately from the multitude of groups proposed for use within the resin component of resist compositions for use with ArF excimer lasers and the like.

Of these groups, a cyclohexyl group, cyclopentyl group, adamantyl group, norbornyl group, or tetracyclododecanyl group is preferred in terms of industrial availability.

Specifically, the structural unit (a1) is preferably at least one unit selected from the general formulas (I), (II), and (III) shown below.

[Formula 2]

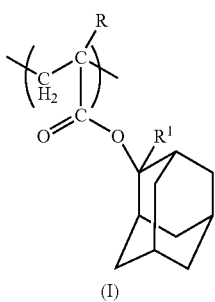

(I)

(wherein, R represents a hydrogen atom or a methyl group, and $R^1$ represents a lower alkyl group)

[Formula 3]

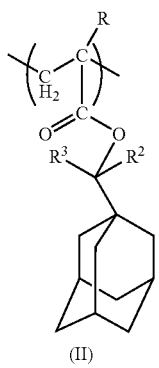

(II)

(wherein, R represents a hydrogen atom or a methyl group, and $R^2$ and $R^3$ each represent, independently, a lower alkyl group)

[Formula 4]

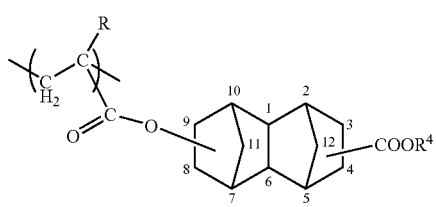

(III)

(wherein, R represents a hydrogen atom or a methyl group, and $R^4$ represents a tertiary alkyl group)

In the formulas, the group $R^1$ is preferably a lower straight-chain or branched alkyl group of 1 to 5 carbon atoms, and suitable examples include a methyl group, ethyl group, propyl group, isopropyl group, n-butyl group, isobutyl group, pentyl group, isopentyl group, and neopentyl group. Of these, an alkyl group of at least 2 carbon atoms, and preferably from 2 to 5 carbon atoms is preferred, and in such cases, the acid dissociability tends to increase compared with the case in which $R^1$ is a methyl group. From an industrial viewpoint, a methyl group or ethyl group is preferred.

The aforementioned groups $R^2$ and $R^3$ each preferably represent, independently, a lower alkyl group of 1 to 5 carbon atoms. These types of groups tend to exhibit a higher acid dissociability than a 2-methyl-2-adamantyl group.

Specifically, the groups $R^2$ and $R^3$ preferably each represent, independently, the same type of lower straight-chain or branched lower alkyl group described above for $R^1$. Of these, the case in which $R^2$ and $R^3$ are both methyl groups is preferred from an industrial viewpoint, and more specifically, the structural unit (a1) is preferably a structural unit derived from 2-(1-adamantyl)-2-propyl(meth)acrylate.

The aforementioned group $R^4$ is a tertiary alkyl group, and preferably a tert-alkyl group of 4 or 5 carbon atoms, such as a tert-butyl group or tert-amyl group, although the case in which $R^4$ is tert-butyl group is preferred industrially.

Furthermore, the group —COOR$^4$ may be bonded to either position 3 or 4 of the tetracyclododecanyl group shown in the formula, although a mixture of both isomers results, and so the bonding position cannot be further specified. Furthermore, the carboxyl group residue of the (meth)acrylate structural unit may be bonded to either position 8 or 9 shown in the formula, although similarly, the bonding position cannot be further specified.

The structural unit (a1) typically accounts for 20 to 60 mol %, and preferably from 30 to 50 mol %, of the combined total of all the structural units within the component (A).

[Structural Unit (a2)]

In the component (A), the structural units (a) preferably also include structural units (a2) derived from a (meth)acrylate ester containing a lactone-containing monocyclic or polycyclic group, in addition to the structural units (a1). Inclusion of these structural units (a2) improves the adhesion between the resist film and the substrate, and reduces the likelihood of film peeling and the like within very fine resist patterns. Furthermore, these structural units (a2) also increase the hydrophilicity of the entire component (A), thereby increasing the affinity between the component and the developing solution, which improves the alkali solubility of the exposed portions and contributes to an improvement in the resolution.

Examples of the structural unit (a2) include structural units in which either a monocyclic group formed from a lactone ring, or an aliphatic polycyclic ring containing a lactone ring, is bonded to an ester side chain of a (meth)acrylate ester. Here, the term lactone ring refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

Specific examples of the structural unit (a2) include monocyclic groups in which one hydrogen atom has been removed from γ-butyrolactone, and polycyclic groups in which one hydrogen atom has been removed from a lactone ring-containing polycycloalkane.

Specifically, structural units represented by structural formulas (IV) to (VII) shown below are preferred.

[Formula 5]

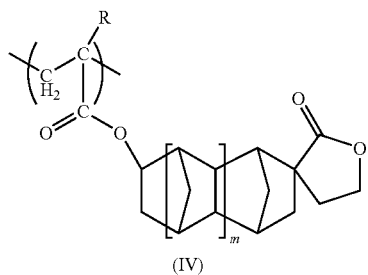

(IV)

(wherein, R is as defined above, and m represents either 0 or 1)

[Formula 6]

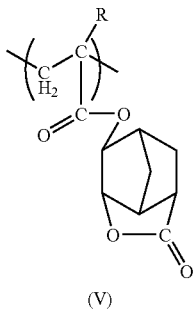

(V)

(wherein, R is as defined above)

[Formula 7]

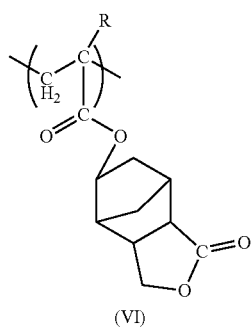

(VI)

(wherein, R is as defined above)

[Formula 8]

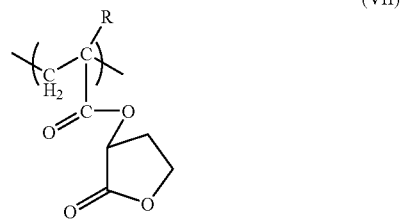

(VII)

(wherein, R is as defined above)

The structural unit (a2) typically accounts for 20 to 60 mol %, and preferably from 20 to 50 mol %, of the combined total of all the structural units that constitute the component (A).

[Structural Unit (a3)]

In the component (A), the structural units (a) preferably also include structural units (a3) derived from a (meth)acrylate ester containing a polar group-containing aliphatic hydrocarbon group, in addition to the structural units (a1), or in addition to the structural units (a1) and the structural units (a2). Inclusion of these structural units (a3) increases the hydrophilicity of the entire component (A), thereby increasing the affinity between the component and the developing solution, which improves the alkali solubility of the exposed portions and contributes to an improvement in the resolution.

Examples of the polar group include a hydroxyl group or cyano group or the like, although a hydroxyl group is preferred.

Examples of the aliphatic hydrocarbon group include straight-chain or branched hydrocarbon groups (alkylene groups) of 1 to 10 carbon atoms, and polycyclic aliphatic hydrocarbon groups (polycyclic groups). As this polycyclic group, any group selected from the same plurality of polycyclic groups listed above for the structural unit (a1) can be used.

When the hydrocarbon group within the polar group-containing aliphatic hydrocarbon group is a straight-chain or branched hydrocarbon group of 1 to 10 carbon atoms, the structural unit (a3) is preferably a structural unit derived from the hydroxyethyl ester of (meth)acrylic acid, whereas when the hydrocarbon group is a polycyclic group, the structural unit (a3) is preferably a structural unit represented by a structural formula (VIII) or (VIII-2) shown below.

[Formula 9]

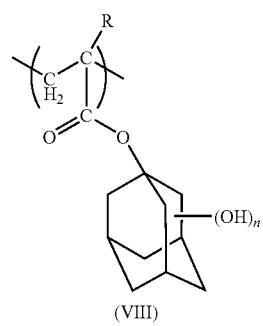

(VIII)

(wherein, R is as defined above, and n is an integer from 1 to 3)

Of these structural units, the unit in which n represents 1, and the hydroxyl group is bonded to position 3 of the adamantyl group is preferred.

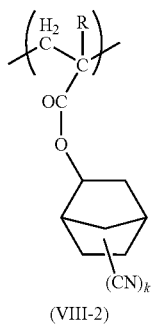

[Formula 10]

(VIII-2)

(wherein, R is as defined above, and k is an integer from 1 to 3)

Of these structural units, units in which k represents 1 are preferred. These units exist as a mixture of isomers (a mixture of compounds in which the cyano group is bonded to either position 4 or 5 of the norbornanyl group).

The structural unit (a3) typically accounts for 10 to 50 mol %, and preferably from 20 to 40 mol %, of the combined total of all the structural units that constitute the component (A).

<Structural Unit (a4)>

The component (A) may also include structural units (a4) derived from a (meth)acrylate ester containing a polycyclic hydrocarbon group that are different from the structural units (a1) through (a3).

Here the expression "different from the structural units (a1) through (a3)" means the structural unit must not duplicate any of the other structural units, although examples of the polycyclic aliphatic hydrocarbon group (the polycyclic group) include the same plurality of polycyclic groups described in relation to the aforementioned structural units (a1) through (a3).

One or more groups selected from amongst a tricyclodecanyl group, adamantyl group, tetracyclododecanyl group, and isobornyl group is preferred in terms of factors such as industrial availability.

Specific examples of the structural unit (a4) include units with the structures shown below in formulas (IX) to (XI).

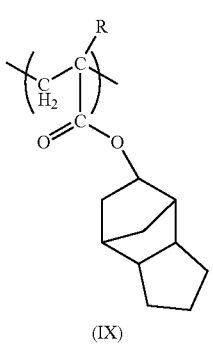

[Formula 11]

(IX)

(wherein, R is as defined above)

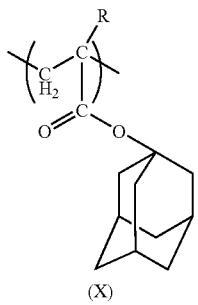

[Formula 12]

(X)

(wherein, R is as defined above)

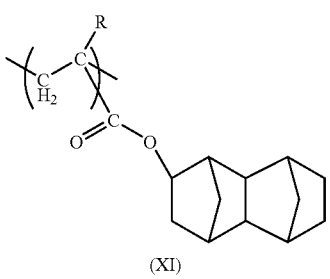

[Formula 13]

(XI)

(wherein, R is as defined above)

The structural unit (a4) typically accounts for 1 to 25 mol %, and preferably from 10 to 20 mol %, of the combined total of all the structural units that constitute the component (A).

The component (A) preferably contains structural units selected from the structural units (a1) through (a4) described above. Of the various possibilities, components containing the structural units (a1) and (a2), components containing the structural units (a1) through (a3), and components containing the structural units (a1) through (a4) are preferred. The most preferred configurations are components containing the structural units (a1) through (a3).

In the present invention, the component (A) may also be a resin having a hydroxyl group bonded to a carbon atom at a polymer terminal, wherein the carbon atom in the α-position to the hydroxyl group has at least one electron-withdrawing group. Combining this type of resin with the component (B) provides a LER improvement effect, and an improvement effect on the level of developing defects, including a particular improvement in the level of developing defects when a contact hole pattern is formed. Furthermore, the sensitivity also improves.

Examples of the electron-withdrawing group include a halogen atom or a halogenated alkyl group.

Examples of suitable halogen atoms include a fluorine atom or a chlorine atom, although a fluorine atom is preferred.

In a halogenated alkyl group, the halogen refers to the same halogen atoms as above. The alkyl group is preferably a lower alkyl group of 1 to 3 carbon atoms, and is even more preferably a methyl group or ethyl group, and most preferably a methyl group. Specific examples of suitable groups include a trifluoromethyl group, difluoromethyl group, monofluoromethyl group, and perfluoroethyl group, although a trifluoromethyl group is particularly desirable.

The number of electron-withdrawing groups is either 1 or 2, but is preferably 2.

The above description of a resin having a hydroxyl group bonded to a carbon atom, wherein the carbon atom in the α-position to the hydroxyl group has at least one electron-withdrawing group can be expressed more specifically, and ideally, as a resin having a —$CR^1R^2OH$ group, wherein $R^1$ and $R^2$ each represent, independently, an alkyl group, halogen atom, or halogenated alkyl group, and at least one of $R^1$ and $R^2$ is an electron-withdrawing group selected from the group consisting of halogen atoms and halogenated alkyl groups.

Here, the halogen atoms and halogenated alkyl groups are as defined above, whereas suitable examples of the alkyl group include lower alkyl groups such as a methyl group, ethyl group, or propyl group. As described above, the electron-withdrawing group is preferably a fluorine atom or a fluorinated alkyl group, and compounds in which both $R^1$ and $R^2$ are fluorinated alkyl groups, and particularly trifluoromethyl groups, are preferred in terms of the ease of synthesis, and the superior effect of the component in reducing LER.

In this case, the proportion within the component (A) of structural units (M1) that include the aforementioned —$CR^1R^2OH$ group bonded to a polymer terminal (hereafter, this group may also be referred to as the "terminal structure") is preferably at least 1 mol % (and preferably 2 mol % or higher) relative to the combined 100 mol % of all the structural units other than the structural units (M1) within the component (A). This combination of all the structural units other than the structural units (M1) includes structural units derived from a conventional polymerization initiator such as azobisisobutyronitrile (AIBN) used in the radical polymerization, and structural units derived from the monomer that represents the primary component of the resin.

There are no particular restrictions on the upper limit for the above proportion, although considering practical factors such as the production method, the value is typically no more than 5 mol %. Furthermore, depending on the nature of the composition, if the proportion of the above terminal structures is too high, then undesirable phenomena such as thickness loss in the resist pattern, and slight tapering at the base of the patterns may occur. The number of mols of the structural unit (M1) is, of course, equal to the number of mols of the terminal structure, and the number of mols of hydroxyl groups.

By ensuring that the proportion is at least 1 mol %, a superior LER improvement effect can be realized as a result of the introduction of the terminal structures. If the proportion is less than this value, then there is a tendency for this effect to deteriorate.

The terminal structure can be introduced at a polymer terminal, for example, by adding a chain transfer agent containing a —$CR^1R^2OH$ group during production of the polymer by radical polymerization using a monomer and a polymerization initiator. In this case, the structural unit (M1) containing the terminal structure is a structural unit (M1) derived from the chain transfer agent.

The chain transfer agent is represented, for example, by a general formula X—R'—$CR^1R^2OH$.

In this general formula, X represents a hydroxyl group or a thiol group, and this chain transfer agent bonds to the polymer terminal through elimination of the hydrogen atom of the hydroxyl group or thiol group. Accordingly, the structural unit (M1) in this case is the unit generated when the hydrogen atom is removed from the hydroxyl group or thiol group of the group X within the formula X—R'—$CR^1R^2OH$. In terms of reactivity, X is preferably a thiol group.

Furthermore, R' represents a bivalent aliphatic hydrocarbon group (which may be a straight-chain, branched-chain, or cyclic group) or a bivalent aromatic hydrocarbon group, and of these, a straight-chain or branched-chain aliphatic hydrocarbon group is preferred.

An example of a suitable alicyclic group is a cyclohexylene group. An example of a suitable aromatic hydrocarbon group is a p-phenylene group.

Examples of suitable straight-chain and branched-chain aliphatic hydrocarbon groups include a methylene group, ethylene group, n-propylene group, and isopropylene group, and of these, an ethylene group or n-propylene group is preferred.

Preferred chain transfer agents can be represented by the general formula SH—$(CH_2)_m$—$C(CF_3)_2$—OH (wherein, m represents an integer from 2 to 4). Accordingly, preferred forms for the structural unit (M1) can be represented by —S—$(CH_2)_m$—$C(CF_3)_2$—OH.

The proportion of the terminal structure (the proportion of the structural unit (M1)) can be altered by adjusting the relative quantities of the monomer and the chain transfer agent, and by adjusting the timing of the addition of the chain transfer agent, thereby altering the weight average molecular weight of the resin for the resist composition.

Furthermore, in a synthesized resist composition resin, the number of mols of the terminal structure (the number of mols of the structural unit (M1)) can be measured by NMR techniques (nuclear magnetic resonance spectroscopy) such as proton-NMR or carbon-NMR.

The weight average molecular weight (the polystyrene equivalent value determined by gel permeation chromatography) of the resin of the component (A) must be no more than 8,000. This molecular weight is even more preferably 7,500 or less, even more preferably within a range from 4,000 to 6,500, and most preferably within a range from 5,000 to 6,500. Provided the weight average molecular weight is no more than 8,000, favorable reductions are achieved in the LER and the level of developing defects. Ensuring that the molecular weight is at least 4,000 simplifies synthesis of the resin. The polydispersity is preferably within a range from 1.0 to 5.0, and even more preferably from 1.0 to 3.0.

Furthermore, the component (A) may include either a single resin, or two or more different resins, and for example, a single resin containing the structural units (a) described above may be used alone, or two or more such resins may be mixed together.

The component (A) can be produced by polymerization, using a conventional radical polymerization or the like, of the monomers that yield each of the structural units, using a radical polymerization initiator such as azobisisobutyronitrile (AIBN).

The quantity of the component (A) within a resist composition of the present invention can be adjusted in accordance with the film thickness of the resist that is to be formed. A typical quantity, expressed as a solid fraction concentration, is within a range from 8 to 25% by weight, and even more preferably from 10 to 20% by weight.

<Component (B)>

A characteristic feature of the present invention is the fact that the component (B) includes a sulfonium compound represented by one of the aforementioned general formulas (b-1) or (b-2) (hereafter also referred to as a sulfonium compound 1 and sulfonium compound 2 respectively).

In the formulas (b-1) and (b-2), X represents a straight-chain or branched alkylene group in which at least one hydrogen atom has been substituted with a fluorine atom, and the number of carbon atoms within the alkylene group is typically within a range from 2 to 6, preferably from 3 to 5, and most preferably 3.

Y and Z each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and even more preferably from 1 to 3. Lower numbers of carbon atoms within the alkylene group X or the alkyl groups Y and Z result in better solubility within the resist solvent, and are consequently preferred.

Furthermore, in the alkylene group X or the alkyl groups Y and Z, the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

$R^1$ to $R^3$ each represent, independently, an aryl group or an alkyl group.

Of the groups $R^1$ to $R^3$, at least one group must represent an aryl group. Compounds in which at least two of $R^1$ to $R^3$ represent aryl groups are preferred, and compounds in which all of $R^1$ to $R^3$ are aryl groups are the most preferred.

There are no particular restrictions on the aryl groups of $R^1$ to $R^3$, and suitable examples include aryl groups of 6 to 20 carbon atoms, such as phenyl groups and naphthyl groups, which may, or may not, be substituted with alkyl groups and/or halogen atoms and the like. In terms of enabling low cost synthesis, aryl groups of 6 to 10 carbon atoms are preferred.

There are no particular restrictions on the alkyl groups of $R^1$ to $R^3$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low cost synthesis, a methyl group is the most desirable.

Of the above possibilities, compounds in which $R^1$ to $R^3$ are all phenyl groups are the most preferred.

These sulfonium compounds 1 and 2 may be used either alone, or in combinations of two or more different compounds.

In the present invention, in order to ensure superior resolution, resist pattern shape, and depth of focus and the like, the component (B) must include a sulfonium compound 1 or 2.

In the component (B), the combined quantity of the one or more compounds selected from the sulfonium compounds 1 and 2 is preferably within a range from 25 to 100% by weight of the entire component (B), with quantities from 30 to 100% by weight being even more desirable. Ensuring that this proportion is at least 25% by weight enables the effects of the present invention to manifest adequately.

In the present invention, the component (B) may also include conventional acid generators typically used in chemically amplified negative resists. A large variety of acid generators are already known, including onium salts such as iodonium salts and sulfonium salts, oxime sulfonates, bisalkyl or bisaryl sulfonyl diazomethanes, nitrobenzyl sulfonates, iminosulfonates, and disulfones, and any of these known acid generators can be used without any particular restrictions.

Of these, onium salts that include a fluorinated alkylsulfonate ion as the anion (hereafter referred to as onium salt-based acid generators) result in the generation of stronger acids, and are consequently ideal.

Examples of suitable cations for these onium salt-based acid generators include mono- or diphenyliodonium cations, and mono-, di-, or triphenylsulfonium cations, all of which may be substituted with lower alkyl groups such as methyl groups, ethyl groups, propyl groups, n-butyl groups, and tert-butyl groups, or lower alkoxy groups such as methoxy groups and ethoxy groups; as well as a dimethyl(4-hydroxynaphthyl)sulfonium cation or the like.

Furthermore, the anion of these types of onium salt-based acid generators is preferably a fluorinated alkylsulfonate ion in which either a portion of, or all of, the hydrogen atoms of a straight-chain alkyl group of 1 to 7 carbon atoms, and preferably 1 to 3 carbon atoms, have been fluorinated, as such anions offer the highest levels of safety. Ensuring the number of carbon atoms is no more than 7 increases the strength of the resulting sulfonic acid. Furthermore, the fluorination ratio (the proportion of fluorine atoms within the alkyl group) of the fluorinated alkylsulfonate ion is preferably within a range from 10 to 100%, and even more preferably from 50 to 100%, and anions in which all of the hydrogen atoms have been substituted with fluorine atoms are particularly desirable as they yield stronger acids. Specific examples of this type of anion include the trifluoromethanesulfonate and heptafluoropropanesulfonate anions.

Specific examples of this type of onium salt-based acid generator include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, and diphenylmonomethylsulfonium trifluoromethanesulfonate, heptafluoropropanesulfonate or nonafluorobutanesulfonate.

These onium salt-based acid generators can be used either alone, or in mixtures of two or more different compounds.

In those cases where a mixture of an onium salt-based acid generator and at least one compound selected from amongst the sulfonium compounds 1 and 2 is used as the component (B), the proportion of the onium salt-based acid generator is preferably within a range from 10 to 75% by weight, and even more preferably from 30 to 70% by weight. By using a blend proportion of the onium salt-based acid generator that falls within this range, a resin with particularly superior levels of LER and developing defects can be obtained. Furthermore, the blend ratio (weight ratio) between the onium salt-based acid generator and the one or more compounds selected from the sulfonium compounds 1 and 2 is preferably within a range from 1:9 to 9:1, even more preferably from 1:5 to 5:1, and most preferably from 1:2 to 2:1. By mixing the acid generators together in this type of ratio, a resin with particularly superior levels of LER and developing defects can be obtained.

The component (B) is typically used in a quantity within a range from 0.1 to 30 parts by weight, preferably from 0.5 to 20 parts by weight, and even more preferably from 1 to 10 parts by weight, per 100 parts by weight of the component (A). At quantities below the lower limit of the above range, image formation becomes impossible, whereas if the quantity exceeds 30 parts by weight, forming a uniform solution becomes difficult, and there is a danger of a deterioration in storage stability.

<Component (C)>

A positive resist composition of the present invention can be produced by dissolving the materials in an organic solvent (C) (hereafter referred to as the component (C)).

As the component (C), any solvent capable of dissolving each of the components used to generate a homogeneous solution is suitable, and the solvent used can be one, or two or more solvents selected from amongst known solvents used for conventional chemically amplified resists.

Examples of suitable solvents include γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used either alone, or as mixed solvents containing two or more different solvents. Mixed solvents of propylene glycol monomethyl ether acetate (PGMEA) and a polar solvent are preferred. The mixing ratio within this type of mixed solvent can be determined on the basis of the co-solubility of the PGMEA and the polar solvent, but is preferably within a range from 1:9 to 9:1, and even more preferably from 2:8 to 8:2.

More specifically, in those cases where ethyl lactate (EL) is added as the polar solvent, the weight ratio of PGMEA:EL is preferably within a range from 2:8 to 8:2, and even more preferably from 3:7 to 7:3. Furthermore, as the organic solvent, a mixed solvent of at least one of PGMEA and EL, together with γ-butyrolactone is also preferred. In such cases, the weight ratio between the former and latter components is preferably within a range from 70:30 to 95:5. There are no particular restrictions on the quantity used of the component (C), which is set in accordance with the film thickness so as to produce a concentration that enables favorable application of the composition to a substrate, and is typically sufficient to produce a solid fraction concentration within the resist composition of 2 to 20% by weight, and preferably from 5 to 15% by weight.

<Component (D)>

In order to improve the resist pattern shape and the post exposure stability of the latent image formed by the patternwise exposure of the resist layer, a nitrogen-containing organic compound (D) (hereafter referred to as the component (D)) can also be added to a positive resist composition of the present invention as an optional component.

A multitude of these components (D) have already been proposed, and one of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These may be used either alone, or in combinations of two or more different compounds.

The component (D) is typically added in a quantity within a range from 0.01 to 5.0 parts by weight per 100 parts by weight of the component (A).

<Component (E)>

Furthermore, in order to prevent any deterioration in sensitivity caused by the addition of the aforementioned component (D), and improve the resist pattern shape and the post exposure stability of the latent image formed by the patternwise exposure of the resist layer, an organic carboxylic acid, or a phosphorus oxo acid or derivative thereof (E) (hereafter referred to as the component (E)) can also be added as an optional component. The component (D) and the component (E) can be used in combination, or either one can also be used alone.

Examples of suitable organic carboxylic acids include malonic acid, citric acid, malic acid, succinic acid, benzoic acid, and salicylic acid. Of these, salicylic acid is preferred.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

<Other Optional Components>

Other miscible additives can also be added to a positive resist composition of the present invention according to need, and examples include additive resins for improving the properties of the resist film, surfactants for improving the ease of application, dissolution inhibitors, plasticizers, stabilizers, colorants, and halation prevention agents.

Conventionally, almost all of the acid generators used in chemically amplified resists are compounds that contain a fluorinated alkylsulfonate ion as the anion, and because acid generators that contain other anions exhibit a lower degree of acidity and a weaker action as an acid generator, they are seldom used. Moreover, as this fluorinated alkylsulfonate ion, ions with longer alkyl chains are preferred as they facilitate formation of very fine resist patterns. The reason that very fine resist patterns can be formed is thought to indicate a short diffusion length within the resist film.

However, fluorinated alkylsulfonate ions with long alkyl chains such as alkyl chains of 8 carbon atoms or more suffer from toxicity problems, and their use is now restricted.

In contrast, a resist composition of the present invention containing an aforementioned sulfonium compound 1 or 2 exhibits high resolution. It is thought that because the sulfonium compound 1 or 2 has a bulky iminosulfonic acid structure as shown in formula (b-1) or (b-2), the diffusion length is short even if the number of carbon atoms is small, meaning a high resolution is achieved. In particular, the sulfonium compound 1 has a cyclic structure, suggesting that an even shorter diffusion length and even better resolution performance can be expected. Furthermore, by combining this acid generator with a resin that has a weight average molecular weight of no more than 8,000 and contains structural units (a) derived from a (meth)acrylate ester, a resist pattern can be formed that exhibits reduced levels of developing defects and LER, a broad depth of focus, and excellent rectangularity.

The present invention has an effect of reducing the level of developing defects, as described above. Here, the term developing defect (or defect) refers to scum and general resist pattern abnormalities detected by inspection of a developed resist pattern from directly above the pattern, using a surface defect inspection device (product name: KLA) from KLA Tencor Corporation. These types of developing defects can cause reductions in process yields, and a deterioration in the product performance, and consequently represent an extremely large problem. A number of factors are thought to cause these developing defects, including the resist resolution performance, irregularities in the alkali solubility arising from insoluble matter or impurities within the resist, and the surface state of the resist.

In the present invention, the reason that the level of developing defects is reduced is thought to relate to the fact that, as described above, the resist resolution performance is one cause of the developing defects, and it is believed that because the present invention exhibits an excellent resolution improvement effect, this results in a reduction in the level of developing defects.

This type of developing defect reduction effect is particularly important in those cases where a fine contact hole (C/H) pattern is to be formed. This is because when a fine C/H pattern is formed, patterning must be conducted with a very low light intensity to ensure formation of a C/H pattern of very small size, and this leads to an increase in the likelihood of developing defects such as blockages within the upper or interior portions of the C/H pattern, or color irregularities.

<<Method for Forming Resist Pattern>>

A method for forming a resist pattern according to the present invention can be conducted, for example, in the manner described below.

Namely, an aforementioned resist composition of the present invention is first applied to the surface of a substrate such as a silicon wafer using a spinner or the like, and PAB (prebake) is then conducted under temperature conditions of 80 to 150° C. for 40 to 120 seconds, and preferably for 60 to 90 seconds. The thus obtained film is then subjected to selective exposure with an ArF excimer laser through a desired mask pattern using, for example, an ArF exposure apparatus, and PEB (post exposure baking) is then conducted under temperature conditions of 80 to 150° C. for 40 to 120 seconds, and preferably for 60 to 90 seconds. Subsequently, a developing treatment is conducted using an alkali developing solution such as a 0.1 to 10% by weight aqueous solution of tetramethylammonium hydroxide. In this manner, a resist pattern which is faithful to the mask pattern can be obtained.

An organic or inorganic anti-reflective film may also be provided between the substrate and the applied layer of the resist composition.

Furthermore, there are no particular restrictions on the wavelength used for the exposure, and exposure can be conducted using an ArF excimer laser, KrF excimer laser, $F_2$ excimer laser, or other radiation such as EUV (extreme ultraviolet), VUV (vacuum ultraviolet), EB (electron beam), X-ray or soft X-ray radiation. A resist composition according to the present invention is particularly effective for exposure using an ArF excimer laser.

EXAMPLES

As follows is a more detailed description of the present invention, using a series of examples.

Synthesis Example 1-1

0.25 mols of a mixture of the monomers (a11), (a21), and (a31) described below was dissolved in 500 ml of methyl ethyl ketone (MEK), and 0.01 mols of AIBN was then added and dissolved. The resulting solution was heated to 65 to 70° C., and this temperature was maintained for a period of three hours. Subsequently, the reaction solution was poured into 3 L of vigorously stirred isopropanol, and the precipitated solid was isolated by filtration. The thus obtained solid product was dissolved in 300 ml of MEK, poured into 3 L of vigorously stirred methanol, and once again the precipitated solid was isolated by filtration and then dried, yielding a resin 1-1 with a weight average molecular weight of 6,200 represented by a formula 14 shown below.

(a11): 2-ethyl-2-adamantyl methacrylate (the monomer corresponding with the structural unit of the general formula (I) wherein R is a methyl group and $R^1$ is an ethyl group): 40 mol %

(a21): norbornane lactone methacrylate (the monomer corresponding with the structural unit of the general formula (VI) wherein R is a methyl group): 40 mol %

(a31): 3-hydroxy-1-adamantyl methacrylate (the monomer corresponding with the structural unit of the general formula (VIII) wherein R is a methyl group, n is 1, and the hydroxyl group is bonded to position 3 of the adamantyl group): 20 mol %

[Formula 14]

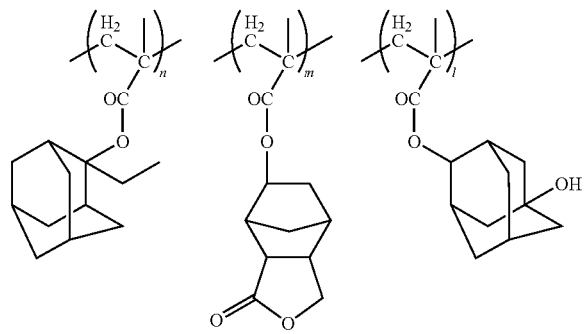

(wherein, n/m/l=40/40/20 (molar ratio))

Synthesis Example 1-2

Using the same composition and method as those of the synthesis example 1-1, a resin 1-2 with a weight average molecular weight of 7,500 was obtained.

Synthesis Example 1-3

Using the same composition and method as those of the synthesis example 1-1, a resin 1-3 with a weight average molecular weight of 9,500 was obtained.

Synthesis Example 2-1

With the exception of replacing the monomers (a11), (a21), and (a31) from the synthesis example 1-1 with the monomers (a12), (a22), and (a32) described below, preparation was conducted in the same manner as the synthesis example 1-1, and yielded a resin 2-1 with a weight average molecular weight of 6,400 represented by a formula 15 shown below.

(a12): 2-methyl-2-adamantyl methacrylate (the monomer corresponding with the structural unit of the general formula (I) wherein R is a methyl group and $R^1$ is a methyl group): 40 mol %

(a22): γ-butyrolactone methacrylate (the monomer corresponding with the structural unit of the general formula (VII) wherein R is a methyl group): 40 mol %

(a32): cyanonorbornanyl methacrylate (the monomer corresponding with the structural unit of the general formula (VIII-2) wherein R is a methyl group and k is 1): 20 mol %

[Formula 15]

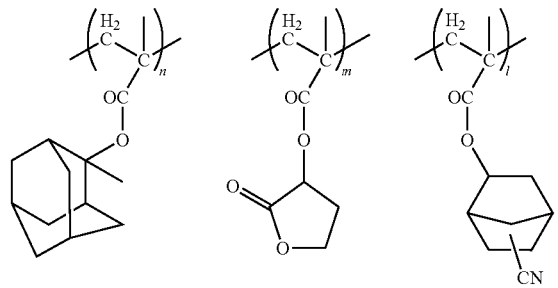

(wherein, n/m/l=40/40/20 (molar ratio))

Synthesis Example 2-2

Using the same composition and method as those of the synthesis example 2-1, a resin 2-2 with a weight average molecular weight of 7,200 was obtained.

Synthesis Example 2-3

Using the same composition and method as those of the synthesis example 2-1, a resin 2-3 with a weight average molecular weight of 9,800 was obtained.

Synthesis Example 3-1

With the exception of replacing the monomer (a32) from the synthesis example 2-1 with the monomer (a31) described below, preparation was conducted in the same manner as the synthesis example 1-1, and yielded a resin 3-1 with a weight average molecular weight of 7,200 represented by a formula 16 shown below.

(a12): 2-methyl-2-adamantyl methacrylate (the monomer corresponding with the structural unit of the general formula (I) wherein R is a methyl group and $R^1$ is a methyl group): 40 mol %

(a22): γ-butyrolactone methacrylate (the monomer corresponding with the structural unit of the general formula (VII) wherein R is a methyl group): 40 mol %

(a31): 3-hydroxy-1-adamantyl methacrylate (the monomer corresponding with the structural unit of the general formula (VIII) wherein R is a methyl group, n is 1, and the hydroxyl group is bonded to position 3 of the adamantyl group): 20 mol %

[Formula 16]

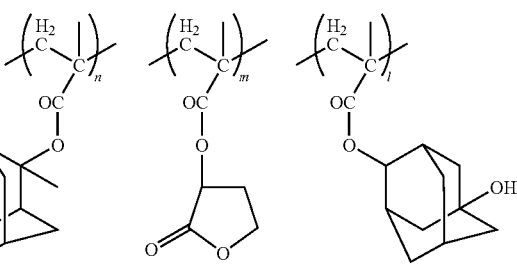

(wherein, n/m/l=40/40/20 (molar ratio))

Synthesis Example 3-2

Using the same composition and method as those of the synthesis example 3-1, a resin 3-2 with a weight average molecular weight of 10,500 was obtained.

Synthesis Example 4

With the exceptions of using the monomers (a41) and (a42) described below, and dissolving the monomers in 250 g of methyl ethyl ketone (MEK), preparation was conducted in the same manner as the synthesis example 1-1, and yielded a resin 4 with a weight average molecular weight of 9,000 represented by a formula 17 shown below.

(a41): maleic anhydride: 50 mol %
(a42): tert-butoxycarbonylnorbornane: 50 mol %

[Formula 17]

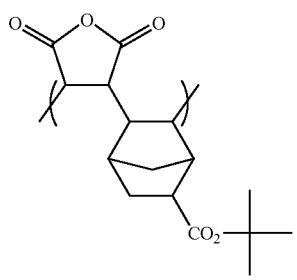

Example 1

A mixture of 100 parts by weight of the resin 1 with a weight average molecular weight of 6,200 obtained in the synthesis example 1-1, 3.0 parts by weight of a sulfonium compound of the aforementioned general formula (b-1), wherein X represents an alkylene group of 3 carbon atoms in which all of the hydrogen atoms have been substituted with fluorine atoms, and $R^1$ to $R^3$ represent phenyl groups (see formula 18, hereafter this compound is referred to as PAG1), as the component (B), and 0.35 parts by weight of triethanolamine as the component (D) was dissolved in a mixture of propylene glycol monomethyl ether acetate (hereafter also abbreviated as PM) and ethyl lactate (EL) (weight ratio 8:2), thereby yielding a positive resist composition with a solid fraction concentration of 8% by weight.

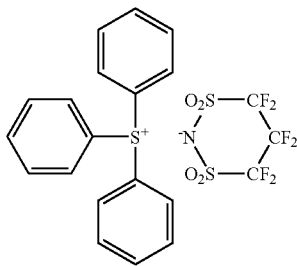

[Formula 18]

Subsequently, an organic anti-reflective film composition ARC-29A (a product name, manufactured by Brewer Science Ltd.) was applied to the surface of a silicon wafer using a spinner, and the composition was then baked and dried on a hotplate at 215° C. for 60 seconds, thereby forming an organic anti-reflective film with a film thickness of 77 nm. The above positive resist composition was then applied to the surface of this organic anti-reflective film using a spinner, and was then prebaked (PAB) and dried on a hotplate at 125° C. for 90 seconds, thereby forming a resist layer with a film thickness of 250 nm.

The thus obtained resist layer was then selectively irradiated with an ArF excimer laser (193 nm) through a mask pattern (binary), using an ArF exposure apparatus NSR-S306 (manufactured by Nikon Corporation; NA (numerical aperture)=0.78, ⅔ annular illumination).

The selectively irradiated resist layer was then subjected to PEB treatment at 110° C. for 90 seconds, subsequently subjected to puddle development for 60 seconds at 23° C. in a 2.38% by weight aqueous solution of tetramethylammonium hydroxide, and was then washed for 20 seconds with water and dried, thus forming a resist pattern.

As a result, the resolution limit for a line and space pattern, when exposure was conducted using the exposure dose required to transfer a 100 nm mask obtained using the positive resist composition of the example 1 at 100 nm, was 90 nm. Furthermore, the sensitivity when a 100 nm line and space pattern was formed at a 1:1 ratio was 30 mJ/cm², and the pattern exhibited favorable shape at the top of the pattern, with excellent verticalness and rectangularity. Furthermore, the 3σ value, which is an indicator of the LER, was also determined for the 100 nm line and space (L&S) pattern formed above. The result indicated a 3σ value for the pattern of 10.0 nm.

The 3σ value is determined by measuring the resist pattern width of a sample at 32 positions using a measuring SEM (S-9220, a product name, manufactured by Hitachi, Ltd.), and calculating the value of 3 times the standard deviation (3σ) from these measurement results. The smaller this 3σ value is, the lower the level of roughness, indicating a resist pattern with a uniform width. Furthermore, defects were measured using a surface defect inspection device KLA2351 (a product name) manufactured by KLA Tencor Corporation, and evaluation of the number of defects on the wafer revealed a result of 0.07 defects/cm². Furthermore, the storage stability as a resist solution was evaluated with a liquid particle counter (product name: PARTICLE SENSOR KS-41, manufactured by Rion Co., Ltd.), using a resist composition sample that has been stored at 40° C. for two weeks following production, and no impurities were detected. Furthermore, the depth of focus (DOF) during formation of a 100 nm line and space (L&S) pattern was 450 nm.

Examples 2 to 9, and Comparative Examples 1 to 4

Using the same method as the example 1, positive resist compositions were prepared with the compositions shown in Table 1.

In the examples 6 and 7, and the comparative example 2, the PEB conditions from the example 1 were altered to 125° C. for 90 seconds. Furthermore, in the example 8 and the comparative example 3, the PAB conditions from the example 1 were altered to 130° C. for 90 seconds, and the PEB conditions were altered to 130° C. for 90 seconds. Furthermore, in the comparative example 4, the PAB conditions from the example 1 were altered to 130° C. for 60 seconds, and the PEB conditions were altered to 130° C. for 60 seconds.

TABLE 1

| | Resin | Mw | Sulfonium compound 1 or 2 | Conventional acid generator | Nitrogen-containing compound | Solvent |
|---|---|---|---|---|---|---|
| Example 1 | Resin 1-1 (100 parts by weight) | 6,200 | PAG1 (3.0 parts by weight) | — | AMINE1 (0.35 parts by weight) | PM/EL = 8/2 |
| Example 2 | Resin 1-2 (100 parts by weight) | 7,500 | PAG1 (3.0 parts by weight) | — | AMINE1 (0.35 parts by weight) | PM/EL = 8/2 |
| Comparative example 1 | Resin 1-3 (100 parts by weight) | 9,500 | PAG1 (3.0 parts by weight) | — | AMINE1 (0.35 parts by weight) | PM/EL = 8/2 |
| Example 3 | Resin 1-1 (100 parts by weight) | 6,200 | PAG1 (2.0 parts by weight) | PAG2 (1.0 parts by weight) | AMINE1 (0.35 parts by weight) | PM/EL = 8/2 |
| Example 4 | Resin 1-1 (100 parts by weight) | 6,200 | PAG1 (1.5 parts by weight) | PAG2 (1.5 parts by weight) | AMINE1 (0.35 parts by weight) | PM/EL = 8/2 |
| Example 5 | Resin 1-1 (100 parts by weight) | 6,200 | PAG1 (1.0 parts by weight) | PAG2 (2.0 parts by weight) | AMINE1 (0.35 parts by weight) | PM/EL = 8/2 |
| Example 6 | Resin 2-1 (100 parts by weight) | 6,400 | PAG1 (1.5 parts by weight) | PAG2 (1.5 parts by weight) | AMINE1 (0.35 parts by weight) | PM/EL = 8/2 |
| Example 7 | Resin 2-2 (100 parts by weight) | 7,200 | PAG1 (1.5 parts by weight) | PAG2 (1.5 parts by weight) | AMINE1 (0.35 parts by weight) | PM/EL = 8/2 |
| Comparative example 2 | Resin 2-3 (100 parts by weight) | 9,800 | PAG1 (1.5 parts by weight) | PAG2 (1.5 parts by weight) | AMINE1 (0.35 parts by weight) | PM/EL = 8/2 |
| Example 8 | Resin 3-1 (100 parts by weight) | 7,200 | PAG1 (1.5 parts by weight) | PAG2 (1.5 parts by weight) | AMINE1 (0.35 parts by weight) | PM/EL = 8/2 |
| Comparative example 3 | Resin 3-2 (100 parts by weight) | 10,500 | PAG1 (1.5 parts by weight) | PAG2 (1.5 parts by weight) | AMINE1 (0.35 parts by weight) | PM/EL = 8/2 |
| Example 9 | Resin 1-1 (100 parts by weight) | 6,200 | PAG3 (1.5 parts by weight) | — | AMINE1 (0.35 parts by weight) | PM/EL = 8/2 |

TABLE 1-continued

|  | Resin | Mw | Sulfonium compound 1 or 2 | Conventional acid generator | Nitrogen-containing compound | Solvent |
|---|---|---|---|---|---|---|
| Comparative example 4 | Resin 4 (100 parts by weight) | 9,000 | PAG1 (3.0 parts by weight) | — | AMINE1 (0.35 parts by weight) | PM/EL = 8/2 |

In Table 1, PAG2 is the compound represented by a formula 19 shown below, and PAG3 is the compound represented by a formula 20 shown below.

AMINE1 is triethanolamine.

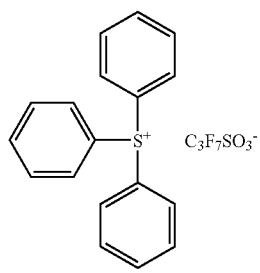

[Formula 19]

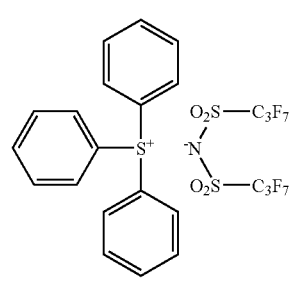

[Formula 20]

The positive resist compositions prepared in the examples 2 through 9 and the comparative examples 1 through 4 were evaluated using the same methods as those used for the example 1, and the results of those evaluations are summarized in Table 2.

TABLE 2

|  | Depth of focus | Sensitivity | Shape | LER | Developing defects | Storage stability as a resist solution |
|---|---|---|---|---|---|---|
| Example 1 | 450 nm | 30 mJ/cm$^2$ | Vertical | 10.0 nm | 0.07 defects/cm$^2$ | No change after 2 weeks at 40° C. |
| Example 2 | 450 nm | 30 mJ/cm$^2$ | Vertical | 10.1 nm | 0.04 defects/cm$^2$ | No change after 2 weeks at 40° C. |
| Comparative example 1 | 350 nm | 33 mJ/cm$^2$ | T-top some collapse | 18.0 nm | 400 defects/cm$^2$ | marked increase in impurities - measurement impossible |
| Example 3 | 500 nm | 24 mJ/cm$^2$ | Extremely vertical | 9.6 nm | 0.07 defects/cm$^2$ | No change after 2 weeks at 40° C. |
| Example 4 | 500 nm | 23 mJ/cm$^2$ | Extremely vertical | 7.5 nm | 0.04 defects/cm$^2$ | No change after 2 weeks at 40° C. |
| Example 5 | 500 nm | 23 mJ/cm$^2$ | Extremely vertical | 7.6 nm | 0.04 defects/cm$^2$ | No change after 2 weeks at 40° C. |
| Example 6 | 500 nm | 35 mJ/cm$^2$ | Extremely vertical | 7.5 nm | 0.4 defects/cm$^2$ | No change after 2 weeks at 40° C. |
| Example 7 | 500 nm | 37 mJ/cm$^2$ | Extremely vertical | 7.5 nm | 0.5 defects/cm$^2$ | No change after 2 weeks at 40° C. |
| Comparative example 2 | 300 nm | 36 mJ/cm$^2$ | T-top some collapse | 15.0 nm | 1350 defects/cm$^2$ | No change after 2 weeks at 40° C. |
| Example 8 | 450 nm | 32 mJ/cm$^2$ | Vertical | 11.0 nm | 0.7 defects/cm$^2$ | No change after 2 weeks at 40° C. |
| Comparative example 3 | 300 nm | 32 mJ/cm$^2$ | T-top some collapse | 17.0 nm | 3050 defects/cm$^2$ | No change after 2 weeks at 40° C. |
| Example 9 | 400 nm | 29 mJ/cm$^2$ | Vertical | 9.5 nm | 0.052 defects/cm$^2$ | No change after 2 weeks at 40° C. |
| Comparative example 4 | 200 nm | 21 mJ/cm$^2$ | Taper thickness loss | 19.5 nm | 50 defects/cm$^2$ | No change after 2 weeks at 40° C. |

As is evident from the above results, the positive resist compositions of the examples 1 through 9 exhibit a high level of resolution, a broad depth of focus, reduced levels of LER and developing defects, and favorable storage stability. Furthermore, in the examples 3 through 7, where a mixture of the sulfonium compound and an onium salt was used as the acid generator, the pattern shape and the LER were particularly superior.

Synthesis example 5

A resin 5 represented by the formula 21 below, wherein —C(CF$_3$)$_2$—OH groups (terminal structures) were bonded to the polymer terminals, was synthesized using the procedure described below.

[Formula 21]

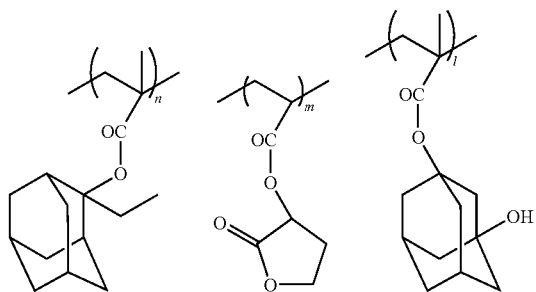

(wherein, n/m/l=40/40/20 (molar ratio))

0.1 mols of a monomer mixture with a composition containing 2-ethyl 2-adamantyl methacrylate/γ-butyrolactone acrylate/3-hydroxy-1-adamantyl methacrylate =40/40/20 (mol %) was dissolved in 150 ml of THF (tetrahydrofuran), a radical polymerization was initiated at 70° C. using AIBN (4 mol % relative to 100 mol % of the above monomer mixture), a compound represented by a chemical formula 22 shown below was added as a polymerization chain transfer agent,

[Formula 22]

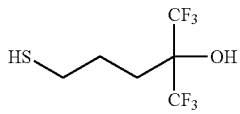

in a quantity equivalent to 2.5 mol % relative to 100 mol % of the combination of the aforementioned monomers and the AIBN, and a polymerization reaction was conducted. Following completion of the polymerization reaction, the reaction solution was poured into 2,000 ml of n-heptane, the resulting mixture was stirred for 30 minutes at 25° C., and the precipitated solid was recovered by filtration. This solid was then redissolved in 200 ml of THF, and once again poured into 2,000 ml of n-heptane, stirred for 30 minutes at 25° C., and the resulting precipitated resin 5 was recovered by filtration. The weight average molecular weight of the resin 5 was 7,000.

Example 10

To the resin 5 (100 parts by weight) obtained in the synthesis example 5 were added and dissolved the components listed below, thus producing a positive photoresist composition.

Component (B): PAG1 (2.5 parts by weight) and a compound represented by a formula 23 shown below (hereafter referred to as PAG4) (1.0 parts by weight)

[Formula 23]

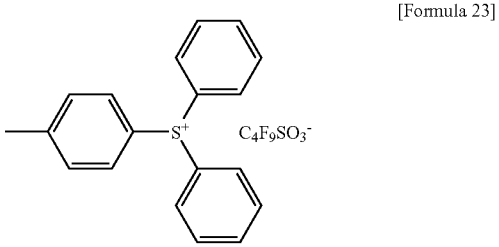

Component (D): triethanolamine (0.1 parts by weight)

Component (E): salicylic acid (0.1 parts by weight)

Component (C): a mixed solvent of propylene glycol monomethyl ether acetate/ethyl lactate=60/40 (weight ratio) (1200 parts by weight)

Subsequently, the thus obtained positive photoresist composition was applied to the surface of a silicon wafer using a spinner, and was then prebaked (PAB treatment) and dried for 90 seconds at 90° C. on a hotplate, thereby forming a resist layer with a film thickness of 220 nm.

This resist layer was then selectively irradiated with an ArF excimer laser (193 nm) through a mask pattern, using an ArF exposure apparatus NSR-S306 (manufactured by Nikon Corporation, NA (numerical aperture)=0.78, σ=0.3).

The selectively irradiated resist layer was then subjected to PEB treatment at 90° C. for 90 seconds, subsequently subjected to puddle development for 60 seconds at a temperature of 23° C. in a 2.38% by weight aqueous solution of tetramethylammonium hydroxide, and was then washed for 20 seconds with water, and dried, yielding a contact hole (CH) pattern with a hole diameter of 300 nm and a pitch of 500 nm. The sensitivity (Eop) was 18.5 mJ/cm$^2$.

When the level of developing defects was evaluated by using a surface defect inspection device KLA2132 (a product name) manufactured by KLA Tencor Corporation to measure the number of defects on the wafer, the result was 8.9 defects/cm$^2$. The measurement of developing defects for very fine hole patterns is extremely difficult, and consequently the developing defects were measured using the 300 nm hole pattern.

Subsequently, the mask was changed to enable confirmation of the resolution and the depth of focus, and an isolated hole pattern of hole diameter 130 nm (pitch: 1,000 nm) and a hole pattern of hole diameter 130 nm (pitch: 220 nm) were obtained. The depth of focus values were 0.25 μm and 0.3 μm respectively.

Comparative Example 5

With the exception of using the PAG4 (1.0 parts by weight) and a compound represented by a formula 24 shown below (hereafter referred to as PAG5) (2.5 parts by weight) as the component (B), a positive resist composition was produced in the same manner as the example 10, and a CH pattern with a hole diameter of 300 nm and a pitch of 500 nm was formed. The sensitivity (Eop) was 32.5 mJ/cm$^2$.

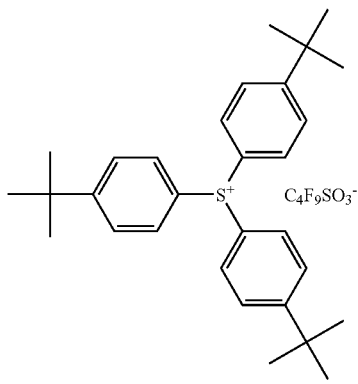

[Formula 24]

The thus obtained CH pattern was evaluated in the same manner as the example 10. The number of developing defects was 77.1 defects/cm², a result that was approximately 10 times that of the example 10.

As is evident from the above results, the resist pattern of the example 10, which used a positive resist composition of the present invention in which the polymer terminals of the component (A) contained —C(CF$_3$)$_2$OH groups, exhibited a low level of developing defects in the contact hole pattern, as well as favorable sensitivity.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

INDUSTRIAL APPLICABILITY

According to a resist composition and a method for forming a resist pattern of the present invention, a resist pattern can be formed that exhibits a high level of resolution, a broad depth of focus, excellent resist pattern shape, and reduced levels of LER and defects. Accordingly, the present invention is extremely important industrially.

The invention claimed is:

1. A resist composition comprising a resin component (A) that undergoes a change in alkali solubility in the presence of acid, and an acid generator component (B) that generates acid on exposure, wherein:

said resin component (A) has a weight average molecular weight of no more than 7,500 and comprises structural units (a) derived from a (meth)acrylate ester, wherein said structural units (a) comprise a structural unit (a1) derived from a (meth)acrylate ester containing an acid dissociable, dissolution inhibiting group which is represented by the following general formula (I),

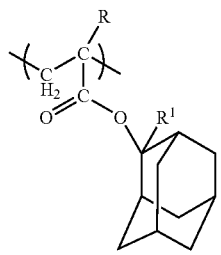

wherein, R represents a hydrogen atom or a methyl group, and R$^1$ represents a lower alkyl group of 2 to 5 carbon atoms, a structural unit (a2) derived from a (meth)acrylate ester comprising a lactone-containing polycyclic group, and a structural unit (a3) derived from a (meth)acrylate ester comprising a hydroxyl group-containing aliphatic hydrocarbon group; and wherein said component (B) comprises a sulfonium compound represented by a general formula (b-1) shown below:

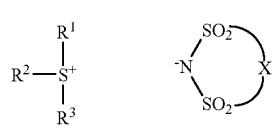

wherein, X represents a perfluoroalkylene group of 3 carbon atoms; R$^1$ to R$^3$ each represents, independently, an aryl group or an alkyl group, and at least one of R$^1$ to R$^3$ represents an aryl group.

2. A resist composition according to claim 1, wherein said component (B) further comprises an onium salt-based acid generator comprising a straight-chain fluorinated alkylsulfonate anion of 1 to 7 carbon atoms.

3. A resist composition according to claim 1, further comprising a nitrogen-containing organic compound.

4. A method for forming a resist pattern, comprising the steps of forming a resist film on a substrate using a resist composition according to claim 1; conducting selective exposure treatment of said resist film; and alkali developing said resist film to form said resist pattern.

5. A resist composition, comprising a resin component (A) that undergoes a change in alkali solubility in the presence of acid, and an acid generator component (B) that generates acid on exposure, wherein said resin component (A) has a weight average molecular weight of no more than 8,000 and comprises structural units (a) derived from a (meth)acrylate ester;

said component (B) comprises a sulfonium compound represented by a general formula (b-1) shown below:

wherein, X represents an alkylene group of 2 to 6 carbon atoms in which at least one hydrogen atom has been substituted with a fluorine atom; R$^1$ to R$^3$ each represents, independently, an aryl group of 6 to 20 carbon atoms or an alkyl group of 1 to 10 carbon atoms, and at least one of $R^1$ to $R^3$ represents an aryl group; and an onium salt-based acid generator comprising a straight-chain fluorinated alkylsulfonate anion of 3 carbon atoms, wherein the blend ratio (weight ratio) between the onium salt-based acid generator and the sulfonium compounds is within the range of 1:9 to 9:1.

6. A resist composition according to claim 5, wherein said structural units (a) comprise structural units (a1) derived from a (meth)acrylate ester comprising an acid dissociable, dissolution inhibiting group.

7. A resist composition according to claim 6, wherein said structural units (a) further comprise structural units (a2) derived from a (meth)acrylate ester comprising a lactone-containing monocyclic or polycyclic group.

8. A resist composition according to claim 6, wherein said structural units (a) further comprise structural units (a3) derived from a (meth)acrylate ester comprising a polar group-containing aliphatic hydrocarbon group.

9. A resist composition according to claim 5, further comprising a nitrogen-containing organic compound.

10. A method for forming a resist pattern, comprising the steps of forming a resist film on a substrate using a resist composition according to claim 5; conducting selective exposure treatment of said resist film; and alkali developing said resist film to form said resist pattern.

11. A resist composition according to claim 5, wherein $R^1$ to $R^3$ each represents, independently, an aryl group of 6 to 10 carbon atoms or an alkyl group of 1 to 10 carbon atoms 12. A resist composition according to claim 5, wherein all of $R^1$ to $R^3$ are aryl groups.

13. A resist composition according to claim 5, wherein the onium salt-based acid generator comprising a straight-chain fluorinated alkylsulfonate anion of 3 carbon atoms has a mono- or diphenyliodonium cation, or a mono-, di-, or triphenylsulfonium cation, all of which may be substituted with lower alkyl groups of 1 to 4 carbon atoms, or a lower alkoxy group of 1 to 2 carbon atoms, as well as a dimethyl(4-hydroxynaphthyl)sulfonium cation 14. A resist composition according to claim 1, wherein the structural units (a2) derived from a (meth)acrylate ester comprising a lactone-containing polycyclic group is a unit which is represented by the following general formula (VI),

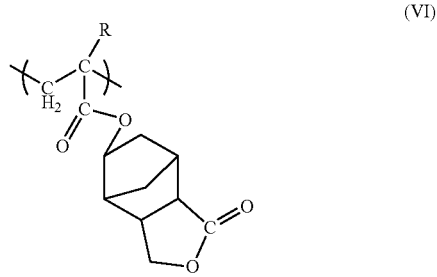

(VI)

wherein, R represents a hydrogen atom or a methyl group.

* * * * *